United States Patent
Xie et al.

(10) Patent No.: US 11,107,731 B1
(45) Date of Patent: Aug. 31, 2021

(54) SELF-ALIGNED REPAIRED TOP VIA

(71) Applicant: INTERNATIONAL BUSINESS MACHINES CORPORATION, Armonk, NY (US)

(72) Inventors: Ruilong Xie, Niskayuna, NY (US); Chih-Chao Yang, Glenmont, NY (US); Carl Radens, LaGrangeville, NY (US); Juntao Li, Cohoes, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/834,725

(22) Filed: Mar. 30, 2020

(51) Int. Cl.
*H01L 21/768* (2006.01)
*H01L 21/3213* (2006.01)
*H01L 23/522* (2006.01)

(52) U.S. Cl.
CPC .... *H01L 21/76885* (2013.01); *H01L 21/3213* (2013.01); *H01L 21/76852* (2013.01); *H01L 21/76897* (2013.01); *H01L 23/5226* (2013.01)

(58) Field of Classification Search
CPC ......... H01L 21/76885; H01L 21/76852; H01L 21/3213; H01L 21/76897; H01L 23/5226
See application file for complete search history.

(56) References Cited

U.S. PATENT DOCUMENTS

| | | |
|---|---|---|
| 5,256,274 A | 10/1993 | Poris |
| 5,368,711 A | 11/1994 | Poris |
| 6,258,709 B1 | 7/2001 | McDaniel |
| 7,205,228 B2 | 4/2007 | Padhi et al. |
| 7,629,264 B2 | 12/2009 | Bonilla et al. |
| 7,951,708 B2 | 5/2011 | DeHaven et al. |
| 8,188,810 B2 | 5/2012 | Fazzio et al. |
| 8,357,609 B2 | 1/2013 | Ryan |
| 9,349,691 B2 | 5/2016 | Murray et al. |
| 9,859,215 B1 | 1/2018 | Edelstein et al. |
| 9,859,433 B1 | 1/2018 | Edelstein et al. |
| 9,875,966 B1 | 1/2018 | Yang |
| 10,128,185 B2 | 11/2018 | Bruce et al. |
| 10,177,028 B1 | 1/2019 | LiCausi et al. |
| 10,177,031 B2 | 1/2019 | Bao et al. |
| 2018/0096902 A1* | 4/2018 | Clevenger ......... H01L 21/30625 |

* cited by examiner

*Primary Examiner* — Karen Kusumakar
(74) *Attorney, Agent, or Firm* — Tutunjian & Bitetto, P.C.; L. Jeffrey Kelly

(57) ABSTRACT

A method for fabricating a semiconductor device includes forming conductive material on a first metallization level including at least one via disposed on at least one conductive line, subtractively patterning the conductive material to form at least one conductive layer corresponding to at least one conductive line of a second metallization level misaligned with the at least one via of the first metallization level, and at least one cavity within the at least one via forming at least one damaged via resulting from the misalignment, and filling the at least one cavity with conductive liner material to form a filled cavity to repair the at least one damaged via.

20 Claims, 10 Drawing Sheets

SELF-ALIGNED REPAIRED TOP VIA

BACKGROUND

The present invention generally relates to semiconductor devices, and more particularly to self-aligned top via formation.

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered interconnect schemes (e.g., single or dual damascene wiring structures) during the back-end-of-line (BEOL) phase of manufacturing. In addition to signal paths, power can be distributed by interconnect structures from the top-most metallization levels in the BEOL stack down to the device level. Within an interconnect structure, conductive vias can run perpendicular to the substrate and conductive lines can run parallel to the substrate.

Patterning processes can include additive and subtractive patterning processes. Additive patterning refers to patterning involving the addition of material to a device (e.g. by deposition), while subtractive patterning refers to patterning involving the removal of material from a device using an etch process. As metal pitches become smaller and pitch lines become thinner, subtractive patterning schemes can be attractive due to, e.g., a lack of conductive liner requirement, and resistance benefits.

SUMMARY

In accordance with an embodiment of the present invention, a method for fabricating a semiconductor device is provided. The method includes forming conductive material on a first metallization level including at least one via disposed on at least one conductive line, subtractively patterning the conductive material to form at least one conductive layer corresponding to at least one conductive line of a second metallization level misaligned with the at least one via of the first metallization level, and at least one cavity within the at least one via forming at least one damaged via resulting from the misalignment, conformally depositing conductive liner material along the at least one conductive layer and within the at least one cavity to form at least one filled cavity, and removing portions of the conductive liner material except for the at least one filled cavity to repair the at least one damaged via.

In accordance with another embodiment of the present invention, a method for fabricating a semiconductor device including a self-aligned top via is provided. The method includes forming conductive material on a first metallization level including at least one via disposed on at least one conductive line, subtractively patterning the conductive material to form at least one conductive layer corresponding to at least one conductive line of a second metallization level misaligned with the at least one via of the first metallization level, and a cavity within the at least one via forming at least one damaged via resulting from the misalignment, selectively growing conductive liner material on exposed conductive material including within the at least one cavity to form at least one filled cavity, and removing portions of the conductive liner material except for the at least one filled cavity and portions of the conductive liner material on sidewalls of the at least one conductive layer to repair the at least one damaged via.

In accordance with yet another embodiment of the present invention, a semiconductor device including a self-aligned top via is provided. The device includes a first metallization level including a reduced sized via disposed on a first conductive line within a first interlevel dielectric (ILD) layer. The reduced sized via includes a cavity adjacent to the first ILD layer. The device further includes a second metallization level including a second conductive line within a second interlevel dielectric (ILD) layer coupled to the reduced sized via, and conductive liner material along a sidewall of the second conductive line extending into the cavity to form a filled cavity to permit the reduced sized via to function as a full sized via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
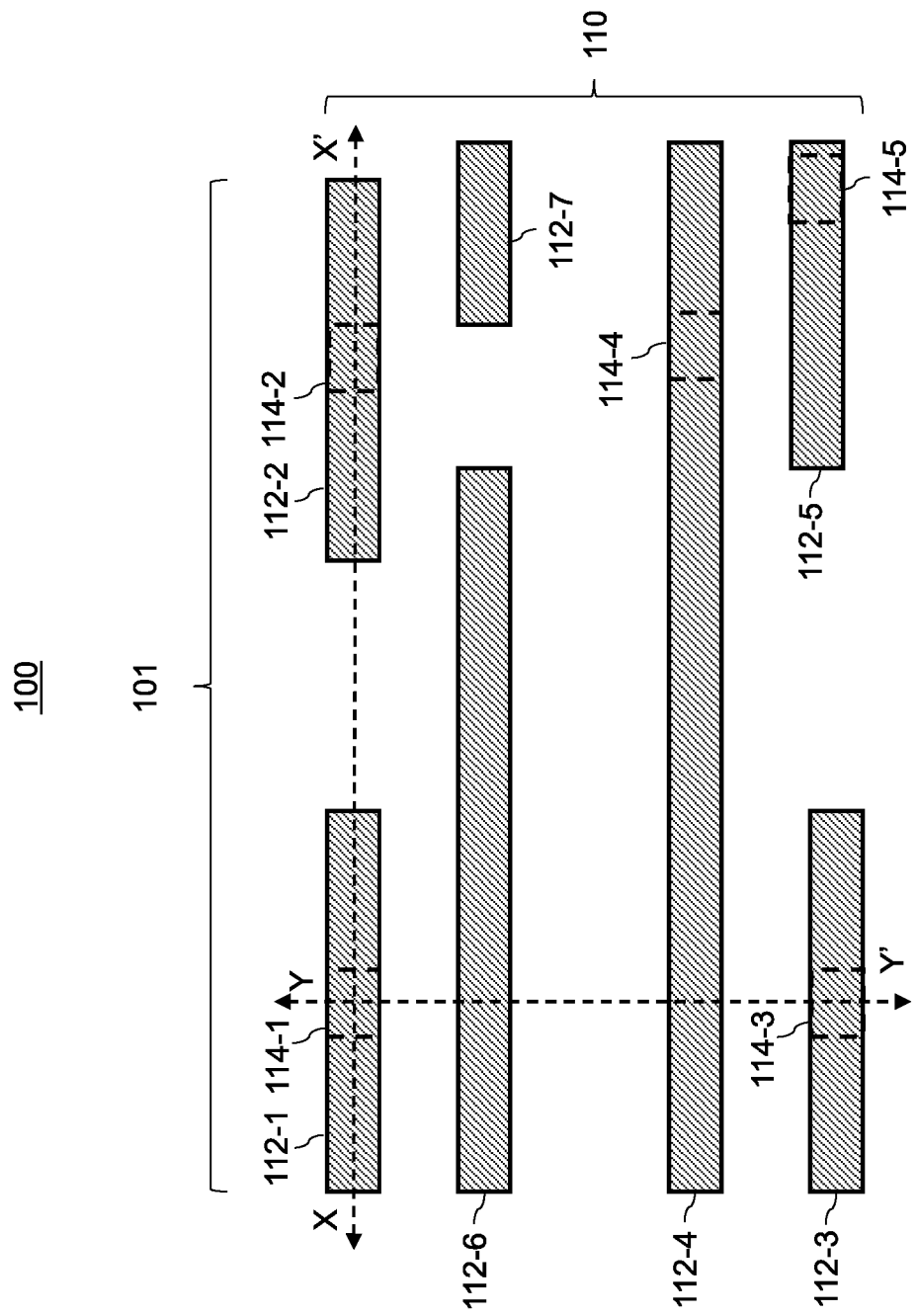
FIG. 1 is a top-down view of an arrangement of a first metallization level of a semiconductor device, in accordance with an embodiment of the present invention.

A semiconductor device can include multiple metallization levels ("levels"), each including a conductive line ("line") formed in an interlevel dielectric layer (ILD). Although the term metallization is used herein, metallization levels can be formed to include any suitable conductive material in accordance with the embodiments described herein. Upper conductive lines can be connected to lower conductive lines by vias. Levels can be identified herein using the designation X, where X is a positive integer from 1 to N. The levels are identified from the level closest to the substrate to the level furthest from the substrate as 1 through N where 1 is the first or lowermost level and N is the last or uppermost level. A conductive line in the X level is designated as an $M_X$ line, and a via in the X level is designated as a $V_{(X-1)}$ via. Note that there are no $V_0$ vias or via bars. When a conductive line in an upper level is designated $M_X$, then a conductive line in an immediately lower level can be designated $M_{(X-1)}$. Likewise, when a conductive line in a lower level is designated $M_X$, then a conductive line in an immediately higher level is designated $M_{(X+1)}$. For a first level (X=1), the conductive line is $M_1$ and there are no "$V_0$" vias as the connection from $M_1$ to devices below $M_1$ is generally made through separately formed contacts in a contact layer ("CA"). For a second level (X=2), the conductive line is $M_2$ and the vias are $V_1$, for a third level (X=3), the conductive line is $M_3$ and the vias or via bars are $V_2$, etc.

The embodiments described herein provide for the formation of a semiconductor device including a first metallization level (e.g., X=1) and a second metallization level (e.g., X=2) formed on the first metallization level. The first metallization level can include a conductive line (e.g., $M_{(X-1)}$, and a via (e.g., $V_X$) formed on the conductive line. The via is referred to herein as a top via.

The second metallization level can include a conductive line (e.g., $M_X$) formed on at least a portion of the via (e.g., $V_X$). More specifically, the conductive line of the second metallization level can be formed by forming conductive material on the first metallization level, and subtractively patterning the conductive line from the conductive material using an etch process. Since there is no liner requirement for subtractive patterning schemes, resistance benefits can be achieved.

In some embodiments, the subtractive patterning process used to form the conductive line of the second metallization level results in a misalignment of the conductive line of the second metallization level to the corresponding via, in which the conductive line of the first metallization level does not fully overlap the top surface of the corresponding via, thereby resulting in the formation of a cavity within the material of the corresponding via. This misalignment can result in drawbacks such as, e.g., resistance and reliability issues. When this occurs, the embodiments described herein provide for the formation of a conductive liner to fill the cavity to repair the via and thus reduce effects of the misalignment. Accordingly, the embodiments described herein can resolve compatibility issues of top via schemes with fully-aligned vias.

In one embodiment, the conductive liner can be conformally deposited along at least the conductive line of the second metallization level and the cavity using any suitable conformal deposition process in accordance with the embodiments described herein. In this embodiment, the device can be processed to remove the conductive liner everywhere except for the portion of the conductive liner filled within the cavity.

In another embodiment, the conductive liner can be selectively grown on exposed conductive material. In this embodiment, the device can be processed to remove the conductive liner everywhere except for the portions conductive liner within the cavity and along sidewalls of the conductive line of the second metallization level. That is, the conductive line of the second metallization level can include a core conductive region, and an outer conductive layer including the conductive liner formed along sidewalls of the core conductive region.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network).

If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product.

The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view a semiconductor device 100 is provided. More specifically, the device 100 includes a base structure 101. The base structure 101 includes a first metallization level 110 including a plurality of conductive lines including conductive lines 112-1 through 112-7 and a plurality of vias including vias 114-1 through 114-5. The vias 114-1 through 114-5 are formed on respective ones of the conductive lines 112-1 through 112-5. Although not shown in FIG. 1, and as will be described in further detail below with reference to FIG. 2, the base structure 101 can further include underlying devices on which the first metallization level 110 is formed on, and an interlevel dielectric (ILD) layer.

The plurality of conductive lines and the plurality of vias can include any suitable conductive material in accordance with the embodiments described herein. Examples of suitable conductive materials that can be used to form the plurality of conductive lines and vias include, but are not limited to, copper (Cu), tungsten (W), cobalt (Co), ruthenium (Ru), aluminum (Al), etc.

As used herein, the term "X-cut" will refer to a cross-section taken through the line X-X' shown in FIG. 1, and the term "Y-cut" refers to a cross-section taken through the line Y-Y' shown in FIG. 1.

Figure 2:
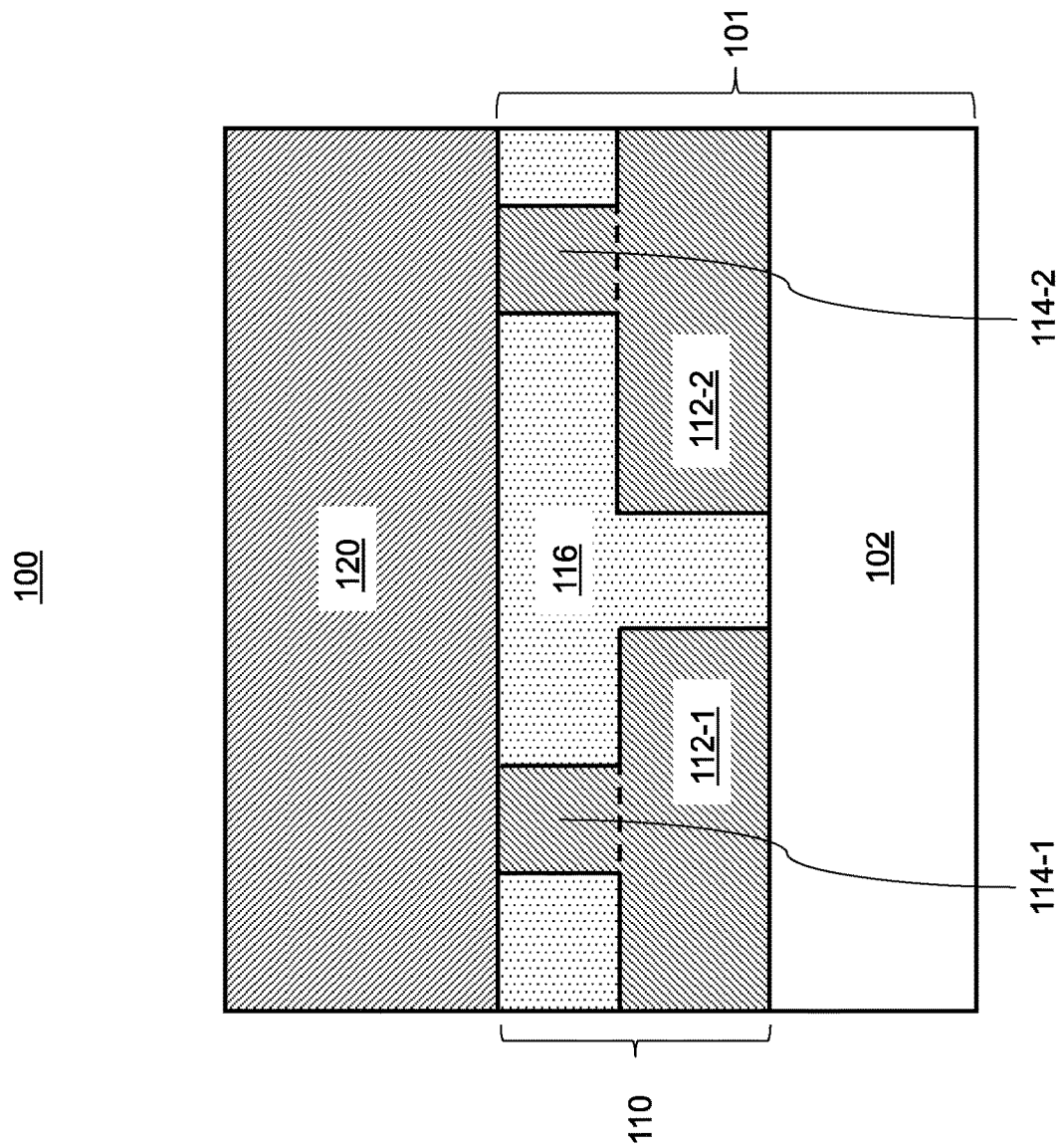
FIG. 2 is a cross-sectional view of the formation of conductive material on the first metallization level during the fabrication of the semiconductor device, in accordance with an embodiment of the present invention.

With reference to FIG. 2, conductive material 120 is formed on the first metallization level 110. More specifically, FIG. 2 provides a cross-sectional view of the device 100 through the X-cut after the formation of the conductive material 120.

As described above with reference to FIG. 1, the device 100 includes a base structure 101 including underlying devices 102 and the first metallization level 110.

For example, the underlying devices 102 can include underlying transistors with contacts. As another example, the underlying devices 102 can include underlying conductive material levels.

The first metallization level 110 further includes an ILD layer 116. The ILD layer 116 can include any suitable material in accordance with the embodiments described herein. For example, the ILD layer 116 can include, e.g., a low-k dielectric material.

A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9.

The ILD layer 116 can have a dielectric constant k between, e.g., about 2.3 and 2.7. In one embodiment, the ILD layer 116 can include an ultra low-k dielectric (ULK) material having a dielectric constant less than or equal to, e.g., about 2.5. Examples of suitable materials that can be used to form the ILD layer 116 include, but are not limited to, octamethylcyclotetrasiloxane (OMCTS), flowable low-k dielectrics (FCVD), spin-on glass dielectrics (SOG), porous silicon carbonitride (SiCN), etc.

The base structure 101 can be formed by forming conductive material on the underlying devices 102, removing portions of the conductive material to form the plurality of lines 112-1 through 112-7 and the plurality of vias 114-1 through 114-5, forming dielectric material on the underlying devices and the conductive material, and planarizing the dielectric material to form the ILD layer 116 (e.g., using chemical-mechanical planarization (CMP)).

The conductive material 120 can include any suitable conductive material in accordance with the embodiments described herein. Examples of suitable conductive materials that can be used to form the conductive material 120 include, but are not limited to, copper (Cu), tungsten (W), cobalt (Co), ruthenium (Ru), aluminum (Al), etc. In one embodiment, the conductive material 120 includes the same material as the plurality of conductive lines 112-1 through 112-7 and the plurality of vias 114-1 through 114-5. In another embodiment, the conductive material 120 includes a different material from the plurality of conductive lines 112-1 through 112-7 and the plurality of vias 114-1 through 114-5.

In some embodiments, although not shown, an adhesion layer can be deposited prior to depositing the conductive material 120. More specifically, the adhesion layer can be a thin layer having a thickness of between, e.g., about 1 nm to about 3 nm. The adhesion layer can include any suitable material in accordance with the embodiments described herein. Examples of materials that can be used to form the thin adhesion layer can include, e.g., titanium nitride (TiN) or tantalum nitride (TaN).

Figure 3:
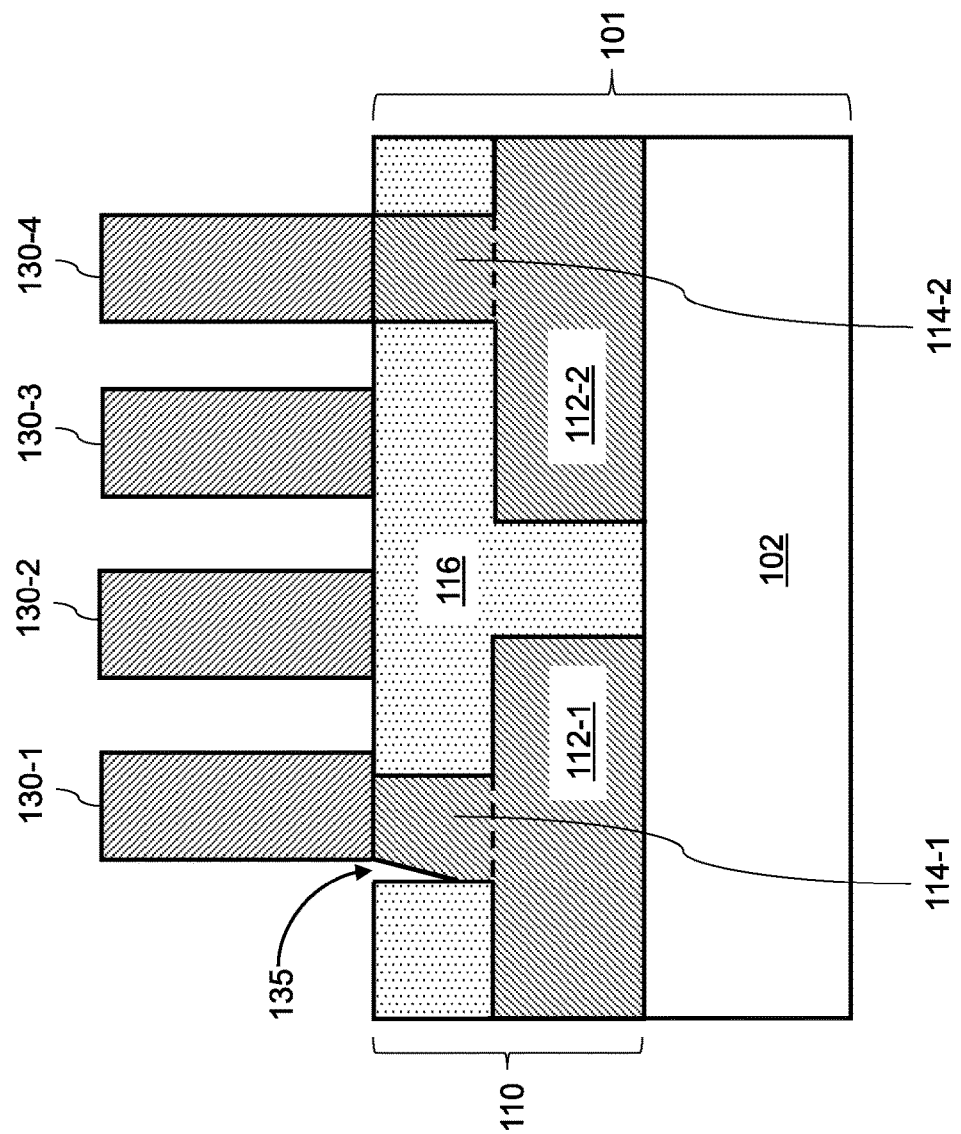
FIG. 3 is a cross-sectional view of the formation of conductive layers from the conductive material including a misalignment resulting in a cavity within a via of the first metallization level during the fabrication of the semiconductor device, in accordance with an embodiment of the present invention.

With reference to FIG. 3, a plurality of conductive layers are formed by subtractively patterning the conductive material 120 using an etch process. More specifically, the plurality of conductive layers include a conductive layer 130-1 formed on the via 114-1, conductive layers 130-2 and 130-3 formed on the ILD layer 116, and a conductive layer 130-4 formed on the via 114-2. Although not shown in FIG. 3, at least one other conductive layer can be formed on the via 114-3 described above with reference to FIG. 1.

The plurality of conductive layers can have a critical dimension or width between, e.g., about 10 nm to about 15 nm. More specifically, the critical dimension can be, e.g., about 12 nm. The pitch between adjacent conductive layers, which is a distance defined herein as the critical dimension plus the distance between the adjacent conductive layers, can be about double the critical dimension. For example, if the critical dimension is about 12 nm, the pitch can be about 24 nm. Accordingly, the distance between adjacent conductive layers can be the same as the critical dimension.

As will be described in further detail below, the plurality of conductive layers correspond to a plurality of conductive lines, and some of the plurality of conductive layers can further correspond to one or more vias disposed on one or more of the conductive lines. The plurality of conductive layers are formed perpendicular to the plurality of conductive lines of the first metallization level 110 (e.g., conductive lines 112-1 through 112-7).

Figure 4:
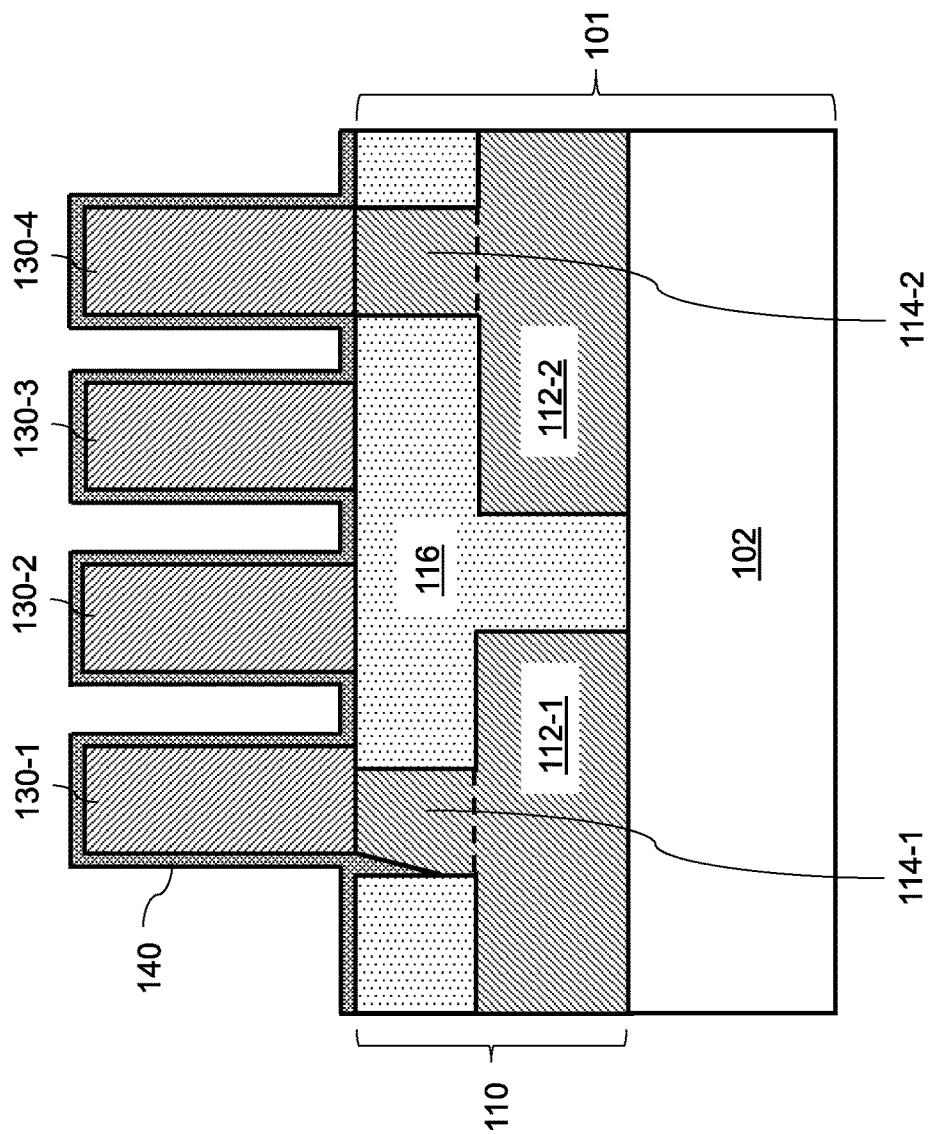
FIG. 4 is a cross-sectional view of the formation of a conductive liner along the conductive layers and within the cavity to repair the via during the fabrication of the semiconductor device, in accordance with an embodiment of the present invention.

As can be seen in the illustrative embodiment of FIG. 4, the subtractive patterning of the conductive material 120 has resulted in the conductive layer 130-4 being well-aligned in that the conductive layer 130-4 is formed substantially entirely over the via 114-2. That is, the via 114-2 has about the same critical dimension as the conductive layer 130-4 (e.g., about 12 nm).

However, as further seen in the illustrative embodiment of FIG. 3, the subtractive patterning of the conductive material 120 can result in the conductive layer 130-1 being misaligned with respect to at least one via of the first metallization level, in this example the via 114-1, due to a non-perfect lithography process. More specifically, the misalignment with respect to the at least one via can result in the formation of at least one cavity within the at least one via, such that the at least one via is a damaged or reduced sized via. In this illustrative example, a cavity 135 has been formed within the via 114-1, such that the via 114-1 is a damaged or reduced sized via, and a portion of the conductive layer 130-1 extends onto the ILD layer 116. That is, the reduced sized via has a width less than the critical dimension of the conductive line 130-1. The damage resulting from the poor lithographic alignment could result in issues such as, e.g., local high via resistance and/or electromigration issues.

To address at least the above-noted issues caused by the misalignment, the at least one reduced sized (e.g., via 114-1) can be repaired by filling the at least one cavity (e.g., cavity 135) with conductive liner material to form a filled cavity that, in combination with the conductive material of the originally formed reduced sized or damaged via(s), forms at least one repaired or full sized via having the proper width. More specifically, the full sized via can be a self-aligned full sized top via. Further downstream processing can then be performed based on the repaired via.

In one embodiment, as will be described in further detail below with reference to FIGS. 5-7, the reduced sized via 114-1 can be repaired into a full sized via in accordance with the embodiments described herein by conformally depositing conductive liner material along the plurality of conductive layers, the ILD layer 116 and within the cavity 135.

In another embodiment, as will be described in further detail below with reference to FIGS. 8-10, the reduced sized via 114-1 can be repaired in accordance with the embodiments described herein by selectively growing conductive liner material only on exposed surfaces of conductive material, including within the cavity 135.

The misalignment of the conductive line 130-1 with respect to the via 114-1 cannot be excessively large such that it results in "pinching-off" of the conductive liner material. Since the width of the cavity 135 has a direct relationship to the amount of misalignment (e.g., a misalignment of about 3 nm can correspond to a cavity width of about 3 nm), the width of the cavity 135 can itself have an upper limit based on the upper limit of misalignment. For example, the width of the cavity 135 can be, e.g., about 50% less than or equal to the width of the conductive line 130-1 (or critical dimension), which is also the width of what the "full sized" via would have been but—for the misalignment.

With reference to FIG. 4, conductive liner material is conformally deposited along the plurality of conductive layers including conductive layers 130-1 through 130-4, the ILD layer 116 and within the cavity 135 to form a conductive liner 140.

Any suitable process can be used to conformally deposit the conductive liner material to form the conductive liner 140 in accordance with the embodiments described herein. In one embodiment, an atomic layer deposition (ALD) process can be used to conformally deposit the conductive liner material to form the conductive liner 140. However, such an embodiment should not be considered limiting.

The conductive liner material used to form the conductive liner 140 can include any suitable material in accordance with the embodiments described herein. Examples of suitable conductive liner materials that can be used to form the conductive liner 140 include, but are not limited to, cobalt (Co), molybdenum (Mo), ruthenium (Ru), etc.

Figure 5:
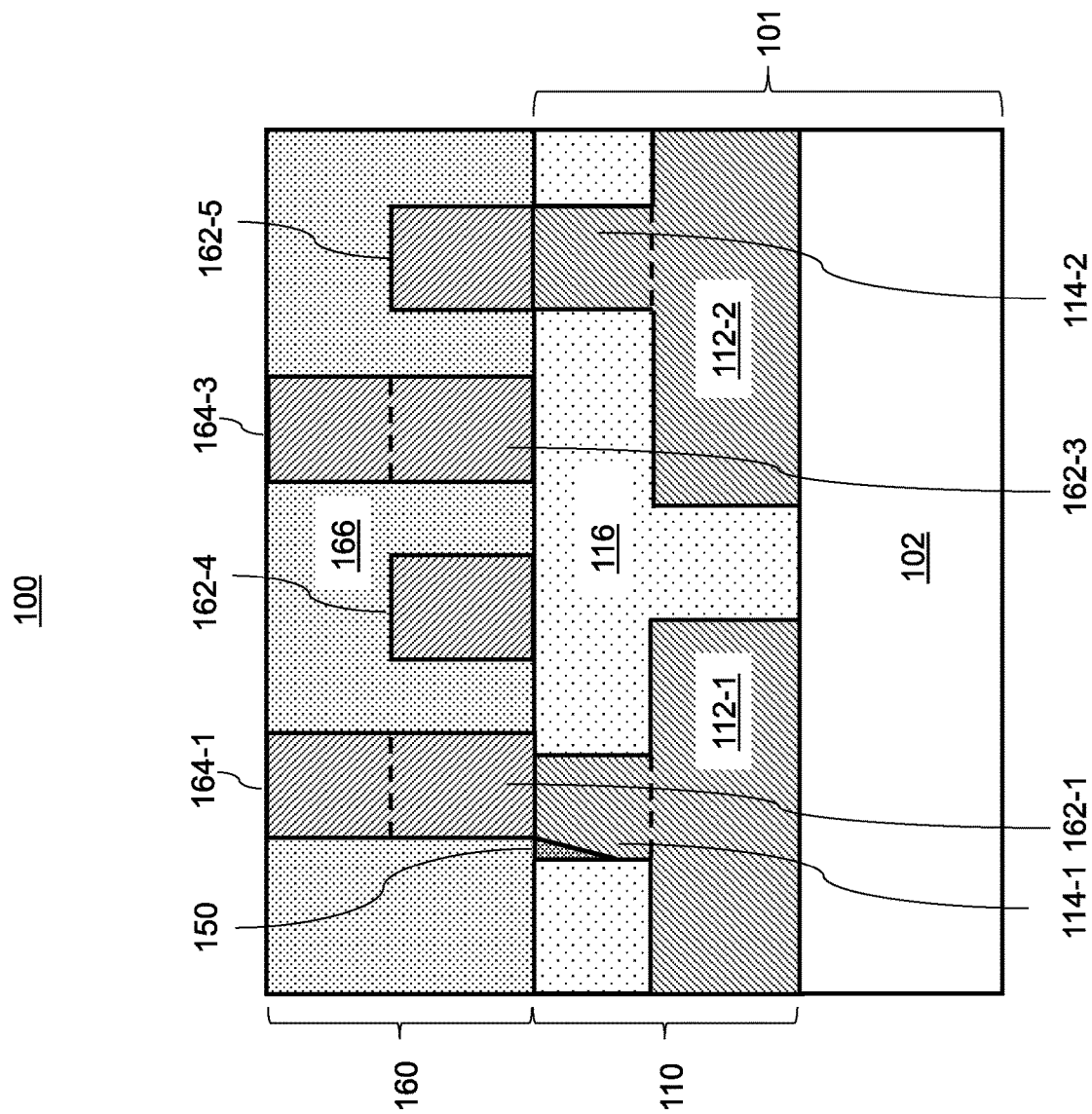
FIG. 5 is a top-down of arrangement of a second metallization level formed from the conductive layers during the fabrication of the semiconductor device, in accordance with an embodiment of the present invention.
Figure 6:
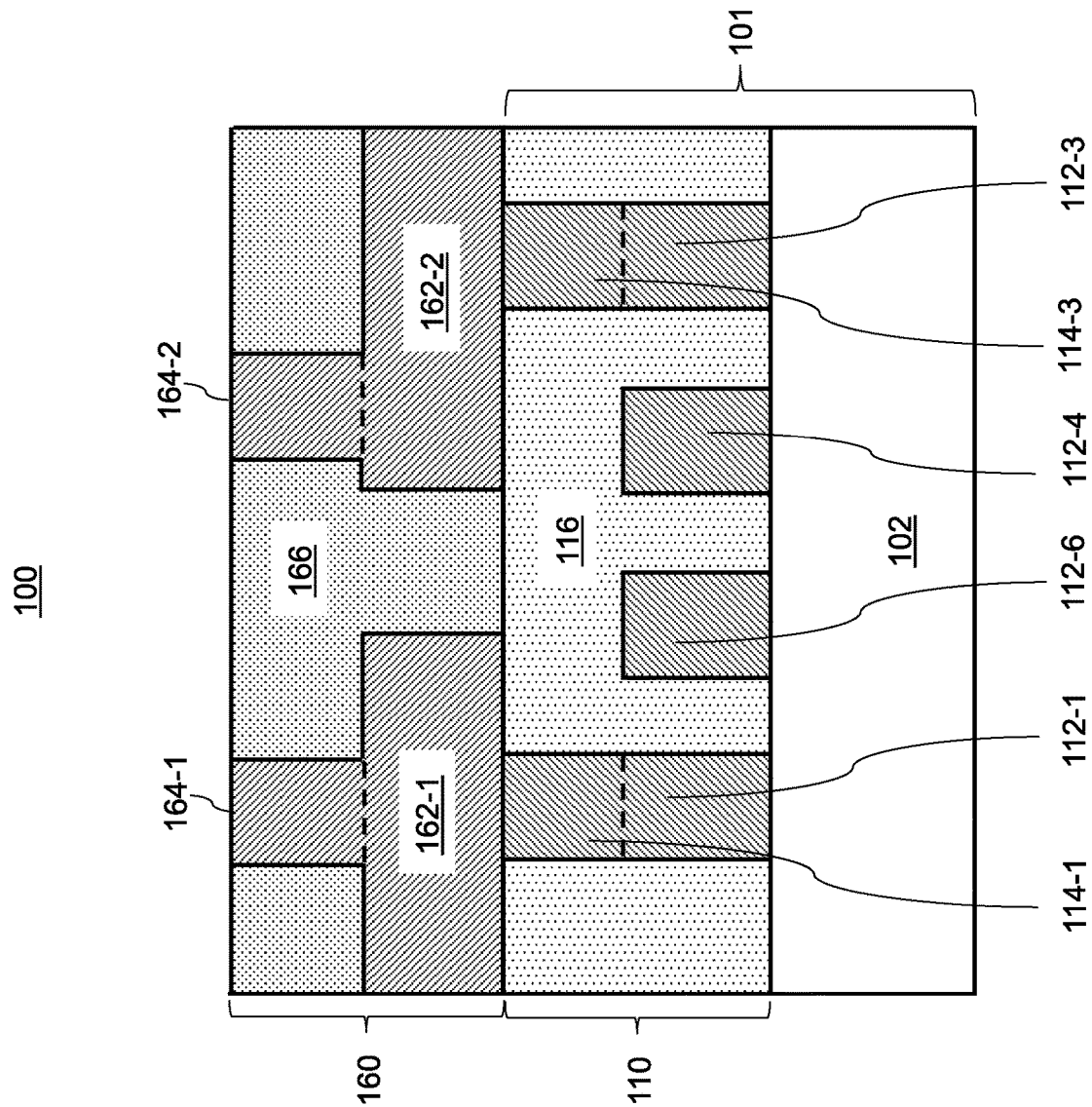
FIG. 6 is a cross-sectional view of the formation of the second metallization level from the conductive layers during the fabrication of the semiconductor device, in accordance with an embodiment of the present invention.

With reference to FIGS. 5 and 6, portions of the conductive liner 140 are removed except for a filled cavity 150. In one embodiment, the portions of the conductive liner 140 can be removed using an isotropic etch back process. More specifically, FIG. 5 provides a cross-sectional view of the device 100 through the X-cut, and FIG. 6 provides a cross-sectional view of the device 100 through the Y-cut.

The filled cavity 150 repairs the reduced sized via 114-1 to permit the reduced sized via 114-1 to function as a full sized via. That is, the conductive material of the originally formed reduced sized via 114-1, which is the same as the conductive material of the conductive line 112-1, and the conductive liner material within the filled cavity 150 collectively form a repaired or full sized via. As mentioned above, since the cavity 135 can have a width of, e.g., less than or equal to about 50% of the critical dimension, the filled cavity 150 can have a width of, e.g., less than or equal to about 50% of the width of the full sized via.

After the portions of the conductive liner 140 are removed, a second metallization level 160 is formed. The second metallization level 160 includes a plurality of conductive lines and a plurality of vias. For example, as shown, the second metallization level 160 can include conductive lines 162-1 through 162-5 and vias 164-1, 164-2, and 164-3 formed on the conductive lines 162-1, 162-2 and 162-3, respectively. However, such an embodiment should not be considered limiting.

The plurality of conductive lines and vias of the second metallization level 160 can include any suitable conductive material in accordance with the embodiments described herein. Examples of suitable conductive materials that can be used to form the plurality of conductive lines and vias of the second metallization level 160 include, but are not limited to, copper (Cu), tungsten (W), cobalt (Co), ruthenium (Ru), aluminum (Al), etc.

The second metallization level 160 further includes an ILD layer 166. The ILD layer 166 can include any suitable material in accordance with the embodiments described herein. For example, the ILD layer 166 can include, e.g., a low-k dielectric material. In one embodiment, the ILD layer 166 can include a ULK material. Examples of suitable materials that can be used to form the ILD layer 116 include, but are not limited to, octamethylcyclotetrasiloxane (OMCTS), flowable low-k dielectrics (FCVD), spin-on glass dielectrics (SOG), porous silicon carbonitride (SiCN), etc.

Figure 7:
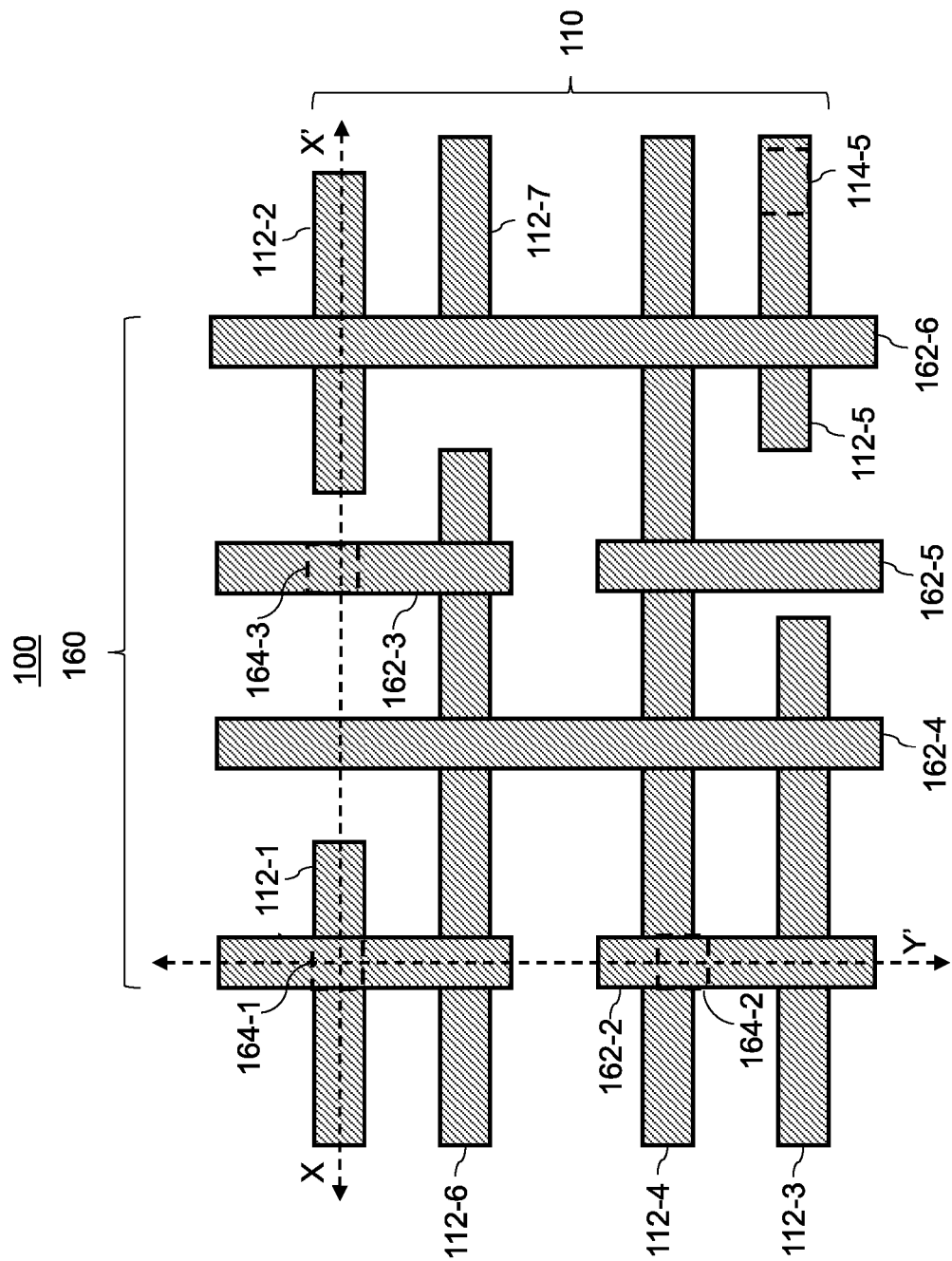
FIG. 7 is another cross-sectional view of the semiconductor device shown in FIG. 5, in accordance with an embodiment of the present invention.

With reference to FIG. 7, a top-down view is provided showing the arrangement of the second metallization level 160 of the device 100 shown in FIGS. 5 and 6. For the sake of clarity, the base structure 101 and the ILD layer 166 have been omitted from FIG. 7.

More specifically, the second metallization level includes a plurality of conductive lines including conductive lines 162-1 through 162-6 and a plurality of vias including vias 164-1 through 164-3. The vias 164-1 through 164-5 are formed on respective ones of the conductive lines 162-1 through 162-5.

Figure 8:
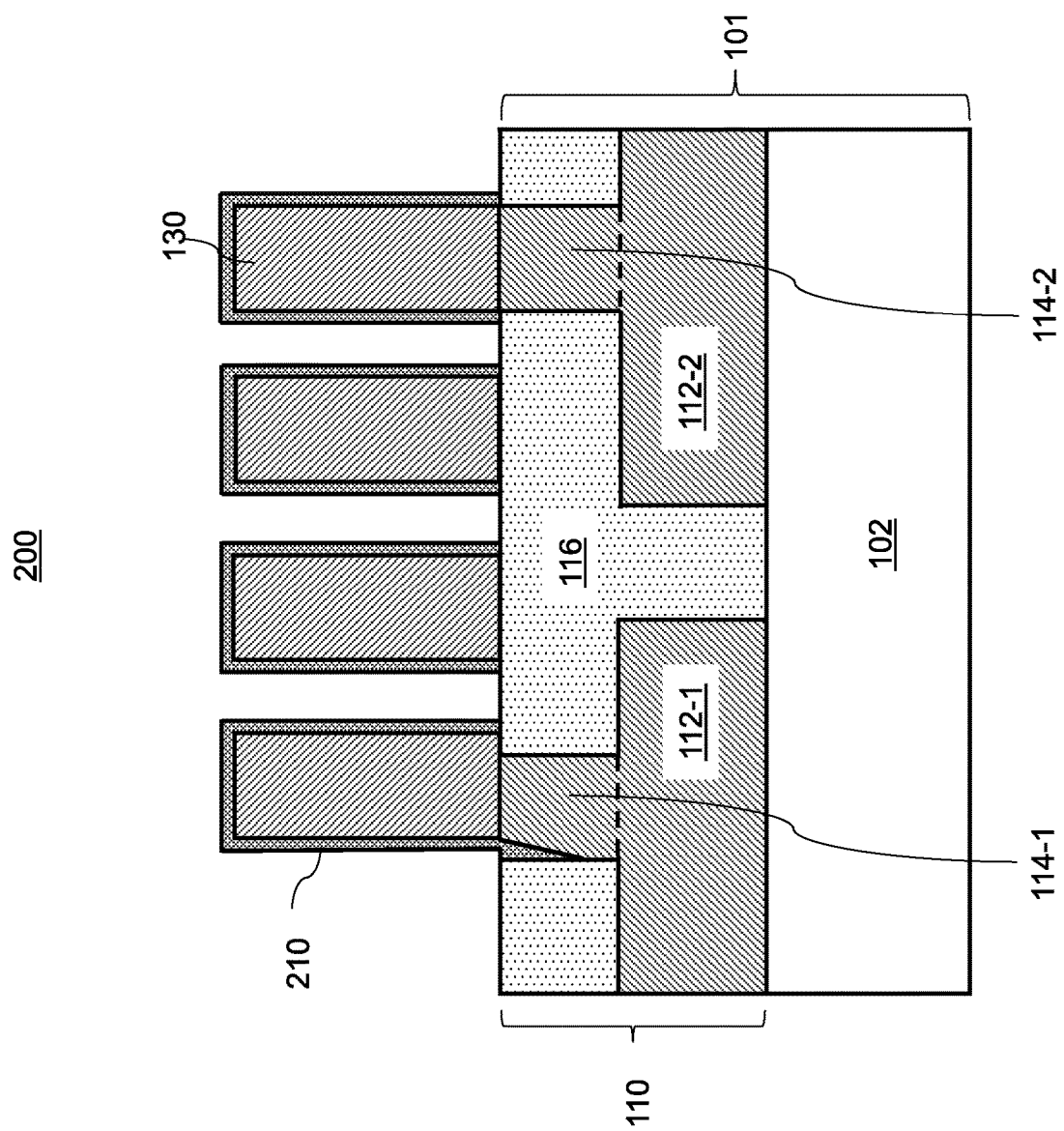
FIG. 8 is a cross-sectional view of the formation of a conductive liner along the conductive lines and within the cavity to repair the via during the fabrication of the semiconductor device, in accordance with another embodiment of the present invention.

With reference to FIG. 8, a cross-sectional view is provided illustrating a semiconductor device 200. It is assumed that the device 200 has been processed in the manner described above with reference to FIGS. 1-3.

As shown in FIG. 8, instead of conformally depositing conductive liner material along the plurality of conductive layers, along the ILD layer 116 and within the cavity 135 to form a conductive liner as described above with reference to FIG. 5, conductive liner material can be selectively grown on exposed surfaces of conductive material to form a conductive layer 210 along the surfaces of the plurality of conductive layers and within the cavity 135. Since there is a higher chemical concentration in the cavity 135 as compared to the other exposed surfaces of conductive material, faster growth rate can be expected.

Any suitable process can be used to form the conductive liner 210 in accordance with the embodiments described herein. Examples of processes that can be used to form the conductive liner 210 include, but are not limited to, ALD, chemical vapor deposition (CVD), electroless deposition, etc. The conductive liner material used to form the conductive liner 210 can include any suitable material in accordance with the embodiments described herein. Examples of suitable conductive liner materials that can be used to form the conductive liner 210 include, but are not limited to, cobalt (Co), ruthenium (Ru), tungsten (W), etc.

Figure 9:
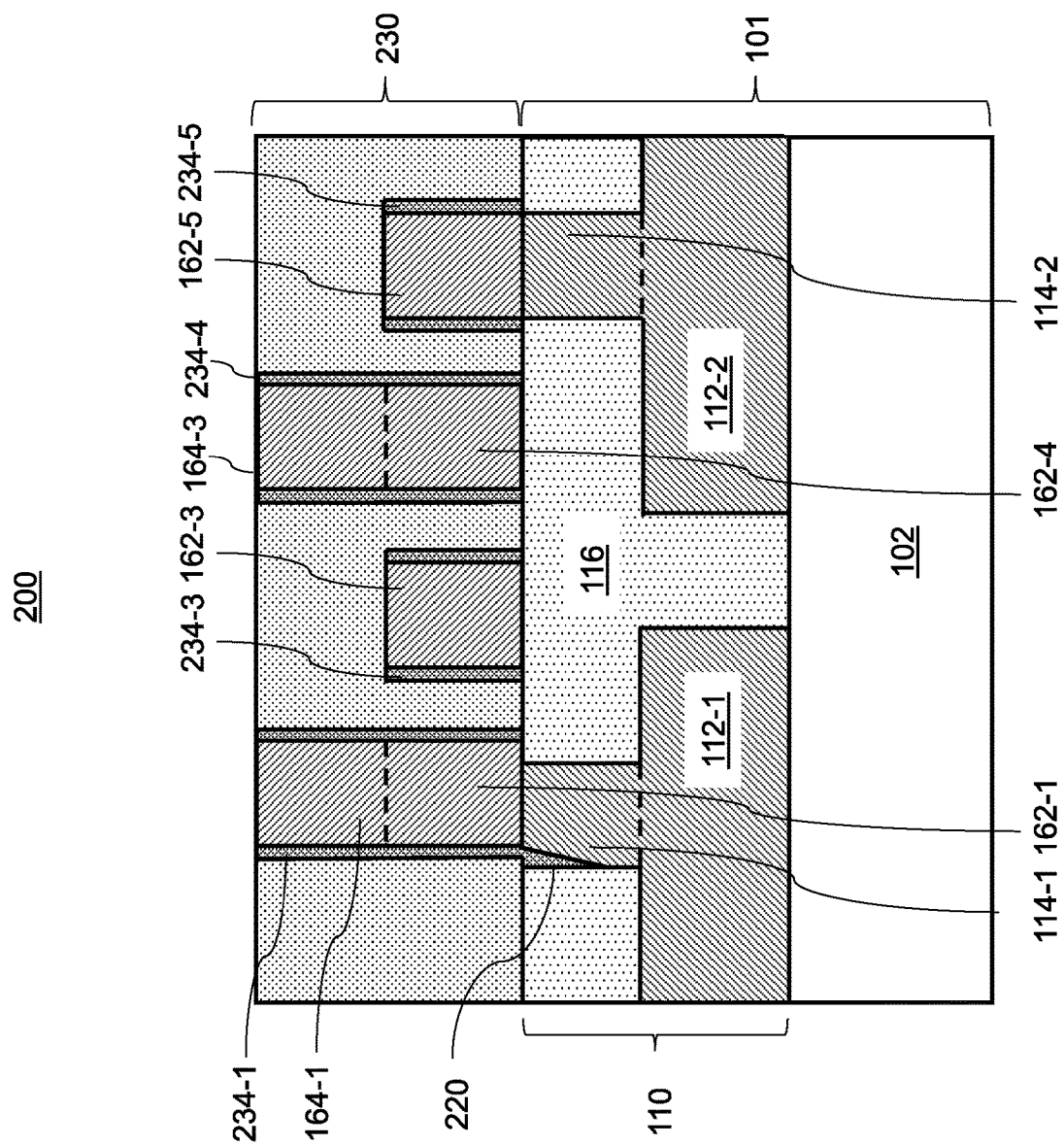
FIG. 9 is a cross-sectional view of the formation of a second metallization level during the fabrication of the semiconductor device, in accordance with another embodiment of the present invention.
Figure 10:
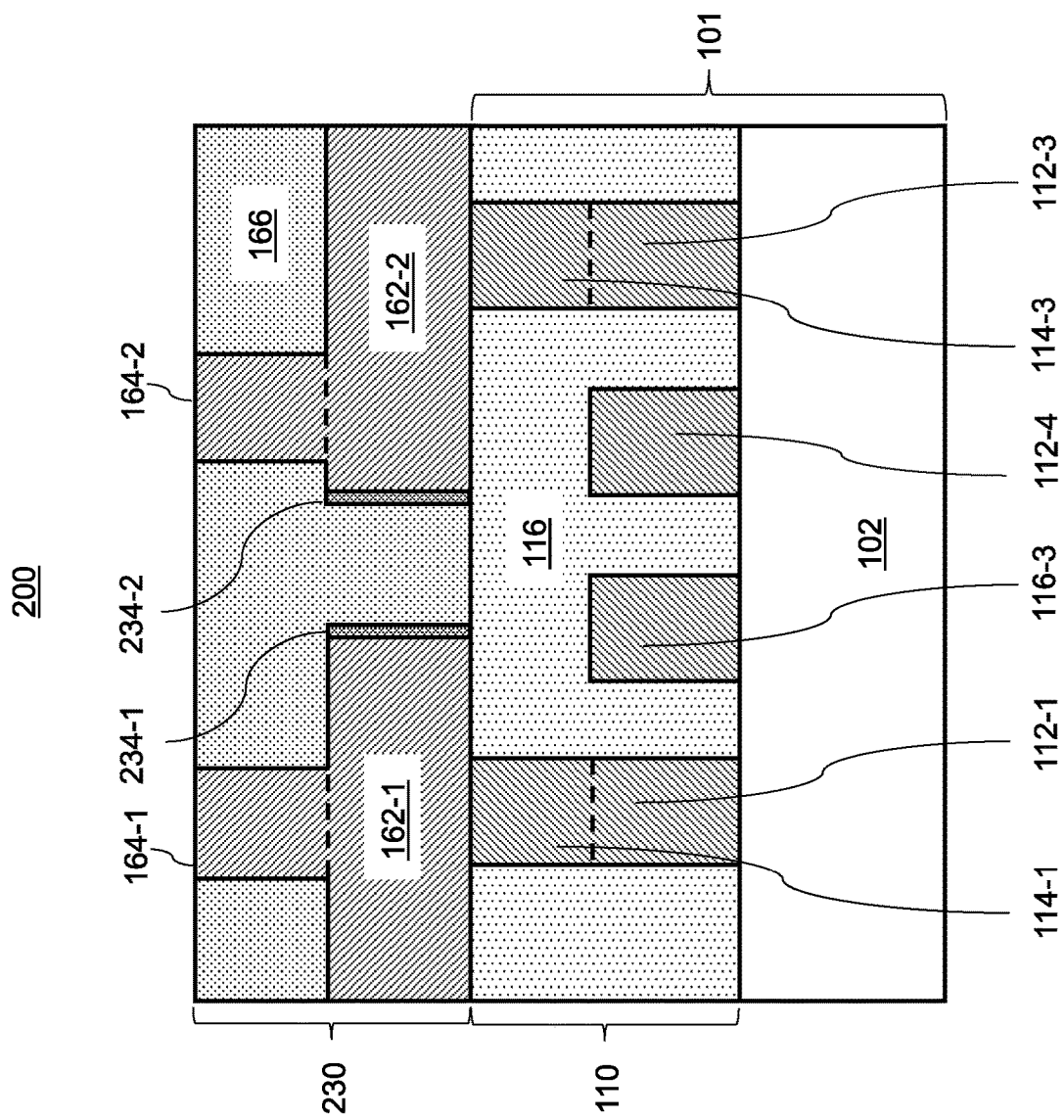
FIG. 10 is another cross-sectional view of the semiconductor device shown in FIG. 9, in accordance with an embodiment of the present invention.

With reference to FIGS. 9 and 10, processing is performed on the device 200 to remove portions of the conductive liner 210 to form a filled cavity 220, and to form a second metallization level 230. A top-down view of the arrangement of the second metallization level of the device 200 can be the same or similar to that shown in FIG. 7 with respect to the device 100. More specifically, FIG. 9 provides a cross-sectional view of the device 200 through the X-cut, and FIG. 10 provides a cross-sectional view of the device 200 through the Y-cut.

The filled cavity 220 repairs the reduced sized via 114-1. That is, the conductive material of the reduced sized via 114-1, which is the same as the conductive material of the conductive line 112-1, and the conductive liner material within the filled cavity 220 collectively form a repaired or full sized via. Similar to the filled cavity 150, since the cavity 135 can have a width of, e.g., less than or equal to about 50% of the critical dimension, the filled cavity 220 can have a width of, e.g., less than or equal to about 50% of the width of the full sized via.

Similar to the device 100 described above with reference to FIGS. 5-7, the second metallization level 230 includes the plurality of conductive lines including conductive lines 162-1 through 162-5, the plurality of vias including vias 164-1, 164-2, and 164-3 formed on conductive lines 162-1, 162-2 and 162-3, respectively, and the ILD layer 166.

However, in contrast to the device 100 described above with reference to FIGS. 5-7, in which all of the conductive liner material is removed from the conductive material within the second metallization level 160 during the formation of the repaired or full sized via, portions of the conductive liner 210 remain on sidewalls of core conductive regions within the second metallization level 202 as outer conductive layers.

More specifically, an outer conductive layer 234-1 is formed on sidewalls of a first core conductive region including the conductive line 162-1 and the via 164-1, an outer conductive layer 234-2 is formed on sidewalls of a second core conductive region including the conductive line 162-2 and the via 164-2, an outer conductive layer 234-3 is formed on sidewalls of a third core conductive region including the conductive line 162-3, an outer conductive layer 234-4 is formed on sidewalls of a fourth core conductive region including the conductive line 162-4 and the via 164-3, an outer conductive layer 234-1 is formed on sidewalls of a first core conductive region including the second level conductive line 162-1 and the via 164-1, and an outer conductive layer 234-5 is formed on sidewalls of a fifth core conductive region including the conductive line 162-5.

Having described preferred embodiments of a semiconductor device and a method of fabricating the same (which are intended to be illustrative and not limiting), it is noted that modifications and variations can be made by persons skilled in the art in light of the above teachings.

It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:

forming conductive material on a first metallization level including at least one via disposed on at least one conductive line;

subtractively patterning the conductive material to form at least one conductive layer corresponding to at least one conductive line of a second metallization level misaligned with the at least one via of the first metallization level, and at least one cavity within the at least one via forming at least one damaged via resulting from the misalignment;

conformally depositing conductive liner material along the at least one conductive layer and within the at least one cavity to form at least one filled cavity; and removing portions of the conductive liner material except for the at least one filled cavity to repair the at least one damaged via.

2. The method of claim 1, wherein the first metallization level is disposed on underlying devices within a base structure.

3. The method of claim 1, wherein the first metallization level further includes an interlevel dielectric (ILD) layer.

4. The method of claim 1, wherein the at least one conductive layer further includes at least one via of the second metallization level disposed on the at least one conductive line of the second metallization level.

5. The method of claim 1, wherein the at least one cavity has a width of less than or equal to about 50% of a width of the at least one conductive line.

6. The method of claim 1, further comprising completing formation of the second metallization level, including forming an interlevel dielectric (ILD) layer within the second metallization level.

7. The method of claim 1, wherein forming the conductive material on the first metallization level further includes forming at least a first via disposed on a first conductive line and a second via disposed on a second conductive line.

8. The method of claim 7, wherein subtractively patterning the conductive material to form the at least one conductive layer further includes forming:

a first conductive layer corresponding to a first conductive line of the second metallization level misaligned with first via of the first metallization level; and a second conductive layer corresponding to a second conductive line of the second metallization level well-aligned with the second via of the first metallization level.

9. A method for fabricating a semiconductor device, comprising:

forming conductive material on a first metallization level including at least one via disposed on at least one conductive line;

subtractively patterning the conductive material to form at least one conductive layer corresponding to at least one conductive line of a second metallization level misaligned with the at least one via of the first metallization level, and a cavity within the at least one via forming at least one damaged via resulting from the misalignment;

selectively growing conductive liner material on exposed conductive material including within the at least one cavity to form at least one filled cavity; and removing portions of the conductive liner material except for the at least one filled cavity and portions of the conductive liner material on sidewalls of the at least one conductive layer to repair the at least one damaged via.

10. The method of claim 9, wherein the first metallization level is disposed on underlying devices within a base structure.

11. The method of claim 9, wherein the first metallization level further includes an interlevel dielectric (ILD) layer.

12. The method of claim 9, wherein the at least one conductive layer further includes at least one via of the second metallization level disposed on the at least one conductive line of the second metallization level.

13. The method of claim 9, wherein the at least one cavity has a width of less than or equal to about 50% of a width of the at least one conductive line.

14. The method of claim 9, further comprising completing formation of the second metallization level, including forming a second level interlevel dielectric (ILD) layer within the second metallization level.

15. The method of claim 9, wherein forming the conductive material on the first metallization level further includes forming at least a first via disposed on a first conductive line and a second via disposed on a second conductive line.

16. The method of claim 15, wherein subtractively patterning the conductive material to form the at least one conductive layer further includes forming:

a first conductive layer corresponding to a first conductive line of the second metallization level misaligned with first via of the first metallization level; and a second conductive layer corresponding to a second conductive line of the second metallization level well-aligned with the second via of the first metallization level.

17. A semiconductor device, comprising:

a first metallization level including a reduced sized via disposed on a first conductive line within a first interlevel dielectric (ILD) layer, the reduced sized via including a cavity adjacent to the first ILD layer;

a second metallization level including a second conductive line within a second interlevel dielectric (ILD) layer coupled to the reduced sized via; and conductive liner material along a sidewall of the second conductive line extending into the cavity to form a filled cavity to permit the reduced sized via to function as a full sized via.

18. The device of claim 17, wherein the second metallization level further includes a second ILD layer.

19. The device of claim 17, wherein the second metallization level further includes a via disposed on the second conductive line, and wherein the conductive liner material is further disposed along a sidewall of the via on the second conductive line.

20. The device of claim 17, wherein the filled cavity has a width less than or equal to about 50% of a width of the full sized via.

* * * * *